United States Patent [19]
Fandrich et al.

[11] Patent Number: 5,850,509
[45] Date of Patent: Dec. 15, 1998

[54] CIRCUITRY FOR PROPAGATING TEST MODE SIGNALS ASSOCIATED WITH A MEMORY ARRAY

[75] Inventors: Mickey L. Fandrich, Placerville; Jerry A. Kreifels, Citrus Heights; Virgil N. Kynett, El Dorado Hills, all of Calif.

[73] Assignee: Intel Corporation, Santa Clara, Calif.

[21] Appl. No.: 778,182

[22] Filed: Jan. 2, 1997

Related U.S. Application Data

[63] Continuation of Ser. No. 324,385, Oct. 17, 1994, abandoned, which is a continuation of Ser. No. 791,957, Nov. 13, 1991, abandoned.

[51] Int. Cl.⁶ .............................. G06F 11/00; G11C 29/00
[52] U.S. Cl. ................................ 395/183.05; 371/21.1; 395/427
[58] Field of Search ................. 395/183.05, 182.03, 395/182.09, 183.18, 427, 438, 477, 495; 371/21.1, 21.2, 22.1, 2.2, 40.1; 365/201

[56] References Cited

U.S. PATENT DOCUMENTS

| | | | |
|---|---|---|---|
| Re. 34,718 | 9/1994 | Tobita | 365/201 |
| 4,654,849 | 3/1987 | White | 371/21.1 |
| 4,686,456 | 8/1987 | Furuyama | 324/73 R |
| 4,744,061 | 5/1988 | Takemae | 365/201 |
| 4,768,194 | 8/1988 | Fuchs | 371/21.1 |
| 4,975,641 | 12/1990 | Tanaka | 324/158 R |
| 5,144,627 | 9/1992 | Horie | 371/22.1 |
| 5,177,745 | 1/1993 | Rozman | 371/21.1 |
| 5,202,888 | 4/1993 | Ochiai | 371/21.2 |
| 5,222,046 | 6/1993 | Kreifels | 365/230.06 |
| 5,228,000 | 7/1993 | Yamagata | 365/201 |
| 5,267,206 | 11/1993 | Koyabu | 365/201 |
| 5,339,320 | 8/1994 | Fandrich | 371/22.1 |
| 5,369,643 | 11/1994 | Rastgar | 371/15.1 |
| 5,463,757 | 10/1995 | Fandrich et al. | 395/430 |

*Primary Examiner*—Robert W. Beausoliel, Jr.
*Assistant Examiner*—Dieu-Mink Le
*Attorney, Agent, or Firm*—Blakely, Sokoloff, Taylor & Zafman LLP

[57] ABSTRACT

Circuitry for propagating test mode signals associated with a memory array including a plurality of circuits for storing test mode signals, apparatus for selectively providing test mode data to each of the circuits for storing test mode signals, and apparatus for simultaneously activating all of the circuits for storing test mode signals to provide output signals to be used for testing.

3 Claims, 5 Drawing Sheets

CIRCUITRY FOR PROPAGATING TEST MODE SIGNALS ASSOCIATED WITH A MEMORY ARRAY

This is a continuation of application Ser. No. 08/324,385, filed Oct. 17, 1994, now abandoned which is a continuation of application Ser. No. 07/791,957, filed Nov. 13, 1991, now abandoned.

This application is related to U.S. patent Ser. No. 07/791,772, entitled ARCHITECTURE OF CIRCUITRY FOR GENERATING TEST MODE SIGNALS, filed on Nov. 12, 1991, now issued as U.S. Pat. No. 5,339,320, and assigned to the same assignee of the present patent application.

BACKGROUND OF THE INVENTION

1. Field of the Invention

This invention relates to computer circuitry and, more particularly, to apparatus for providing test signals for testing the condition of flash EEPROM memory arrays and control circuitry associated therewith.

2. History of the Prior Art

Electrically programmable read only memories (EPROM) have been used for many different purposes. These circuits provide a quick and relatively inexpensive way of furnishing read-only memory. These memories are readily available in arrays up to four megabits. A difficulty of such memories is that they may be reprogrammed only by removing the circuitry from the system and using ultraviolet light to erase the entire array. To overcome this problem, electrically erasable programmable read only memories (EEPROMs) have been devised.

Recently, a new electrically erasable programmable read only memory called flash EEPROM has been devised. Such a memory array is disclosed in U.S. patent application Ser. No. 667,905, entitled *Low Voltage EEPROM Cell,* Lai et al, filed Nov. 2, 1984, and assigned to the assignee of the present invention. Flash EEPROM may be electrically erased without removing the memory from the system and is available in memory arrays up to two megabits. A difficulty with flash EEPROM, however, is that only the entire array may be erased. This requires that the entire array be reprogrammed once it has been erased.

Techniques by which it is possible to erase blocks of flash EEPROM are being investigated; but, in general, the reprogramming effort required for flash EEPROM is very extensive. Because of this, there are a great number of chances for one programming flash EEPROM to inadvertently provide incorrect commands to the chip. Although some of these incorrect commands may have no effect on the operation of the circuitry, others may have a very deleterious effect. Initial efforts with flash EEPROM have disclosed that the programming of such circuitry is so complicated that it is desirable to limit the ability of a programmer to provide inadvertent commands which may adversely affect the flash EEPROM.

To this end, an arrangement has been devised by which command interface circuitry is interposed between the programmer and the flash EEPROM circuitry. U.S. patent application Ser. No. 07/655,643, entitled *COMMAND STATE MACHINE,* M. Fandrich et al, filed Feb. 11, 1991 (now abandoned, a continuation application Ser. No. 05/155,449 was filed on Jan. 21, 1994 under 37 C.F.R. 1.62), and assigned to the assignee of the present invention discloses such an arrangement. The arrangement eliminates the ability of the user to provide output signal combinations from the interface which might be able to affect the circuitry of the array in an undesirable manner. Essentially, the invention eliminates the possibility of generating unwanted, undesirable, and unknown combinations of signals which might somehow create a defect in the operation of the memory array.

Although the invention disclosed in the above-mentioned patent application assures that users will be unable to generate undesirable programming commands, other commands are also available which might adversely affect the array. Not available to the user are a set of test commands which are used by the command state machine to control a test state machine used for testing the setup and condition of the hardware. The commands generate a number of signals which are stored in test latches grouped in test mode registers to accomplish the testing of the memory array.

Certain of these signals generated by the test commands are stored in widely separated test registers on the integrated circuit of the command system module. These widely separated test registers are sequentially loaded with the signals required for a particular mode. In some tests, it is necessary to send signals from a number of these registers simultaneously. Otherwise, if these signals are sent at different times, it is possible that various test register conditions might be generated as interim states which would undesirably affect the memory array and the circuitry controlling its programming in the same manner that spurious user commands might affect the array if not otherwise precluded.

SUMMARY OF THE INVENTION

It is, therefore, an object of the present invention to provide circuitry to assure that test mode commands do not generate signals which are distorted and might cause undesirable results in a memory array.

It is another more specific object of the present invention to provide arrangements for assuring that all bits which are stored in the test mode registers are propagated by test mode registers simultaneously so that undesirable interim conditions are not generated in a memory array or its control circuitry.

These and other objects of the present invention are realized in circuitry for propagating test signals associated with a memory array comprising a plurality of circuits for storing test mode data, means for selectively providing test mode data to each of the circuits for storing test mode data, and means for simultaneously activating all of the circuits for storing test mode data to provide test signals to be used for testing.

These and other objects and features of the invention will be better understood by reference to the detailed description which follows taken together with the drawings in which like elements are referred to by like designations throughout the several views.

DETAILED DESCRIPTION OF THE INVENTION

Figure 1:
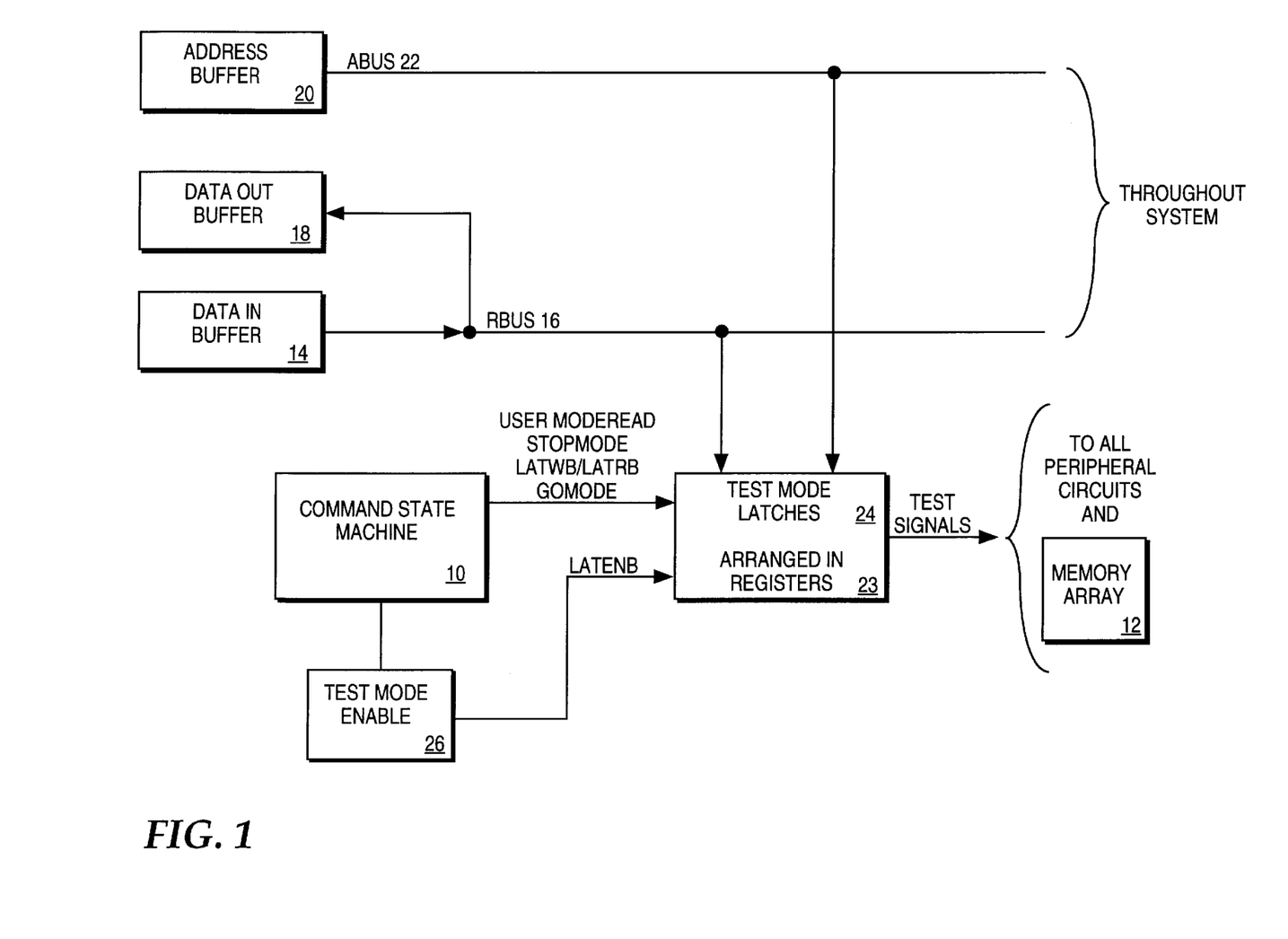
FIG. 1 is a block diagram useful in understanding the invention.

Referring now to FIG. 1 there is illustrated a block diagram of interface circuitry which may utilize the present invention. The interface circuitry includes a command state machine 10 which controls the transfer of test mode command signals and data sent to a memory array 12. In the preferred embodiment, the memory array 12 is a flash EEPROM array although it might comprise some other sort of memory circuitry in which it is desired to eliminate the possibility of erroneous signals which might adversely affect the array. The command state machine 10 receives data from a source external to the interface circuitry through a data input buffer 14. The data input buffer 14 is connected to a data bus RBUS 16 which in the preferred embodiment of the invention includes five individual conductors for transferring five bits of data in parallel to circuitry associated with the bus 16. The bus 16 is also connected to a data out buffer 18 which transfers data from the interface circuitry to external circuitry. An address buffer 20 provides addresses from sources external to the interface circuitry to an address bus ABUS 22. The address bus 22 in the preferred embodiment of the invention includes five individual conductors for transferring five bits of data in parallel to circuitry associated with that bus. Specific details of the command state machine 10, the data input buffer 14, the data output buffer 18, the address buffer 20, and associated connecting circuitry are provided in the above-mentioned patent application entitled *Command State Machine*. These details are not, except as otherwise discussed here, pertinent to this invention and, consequently, are not discussed in this specification.

A plurality of test mode latches 24 which make up a number of test mode registers 23 are joined to each of the data bus 16 and the address bus 22 to receive data and provide the data for transfer to various circuitry external to the interface in order to accomplish the testing of the memory array 12 and its associated circuitry. In the preferred embodiment of the invention, fourteen individual test mode registers 23 each including five individual test mode latches 24 are provided for receiving the test mode data. Each latch 24 in each register 23 stores a single bit of data which is to be provided to the peripheral circuitry (e.g., the test state machine) for determining the operation and condition of the memory array 12. The command state machine 10 provides five test mode command signals to the test mode registers 23 which control the operation of the latches 24. The generation of these test mode command signals and the manner in which they interface with the other commands which may be provided to the command state machine 10 are discussed in depth in the aforementioned patent application.

The five test mode command signals which are provided by the command state machine 10 to the registers 23 are a write command LATWB, a read command LATRB, a GOMODE command sent to initiate the transfer of data signals from all of the latches simultaneously, a STOPMODE command which terminates the output of the latches 24 simultaneously, and a command USERMODEREADS which returns the read operation from the test mode to the main array.

As outlined above, the test mode latches are physically positioned at different points on the integrated circuit arrangement which is the command state machine interface for operating the memory array. Data may only be written to the test mode registers in groups of five bits at one time so the registers are written sequentially. However, any particular test mode command may require that data stored in a number of different test mode registers be used in a single test operation. If data were to be transferred from only one test mode register at a time, combinations of data might result at the circuitry receiving the data which were not the combinations desired. In order to assure that invalid data combinations are not generated which might harm the circuitry or the programmed array, the present invention assures that all of the test mode latches transfer the data they contain to the circuits which are to use that data simultaneously. In this manner, inadvertent transient states (which might deleteriously affect the circuitry) do not occur. The GOMODE command is utilized with certain other signals to assure the simultaneous transfer of data from the latches 24.

Also included in the arrangement with the command state machine 10 and the latches 24 is a test mode enable circuit 26. The test mode enable circuit 26 illustrated in this specification as a simple block is, in fact, is a composite of certain circuitry utilized in the arrangement which is described in the aforementioned patent application. However, for the purposes of this specification, it is only necessary to understand that the circuitry produces enabling signals for effecting appropriate timing of the operations.

In general, during the user mode of operation, a signal LATENB (the "B" indicating a signal having a polarity which is the inverse of the latch enable signal) is furnished to the latches 24 to hold the latches 24 in the reset condition so that they cannot be operated by the user. When test modes are enabled, the reset signal is removed so that the latches 24 are ready to receive data upon receiving a write signal LATWB. Data is then provided to the various test mode latches 24 on data bus 16. The particular latches 24 which receive each piece of data are selected by addresses furnished on the address bus 22. When all of the data required by the particular test mode are in position in the various latches 24 and the test is to be executed, the GOMODE signal is transferred to the latches and causes all latches 24 to generate test signals by simultaneously transferring data from the latches 24 of the test mode registers 23.

Figure 2A:
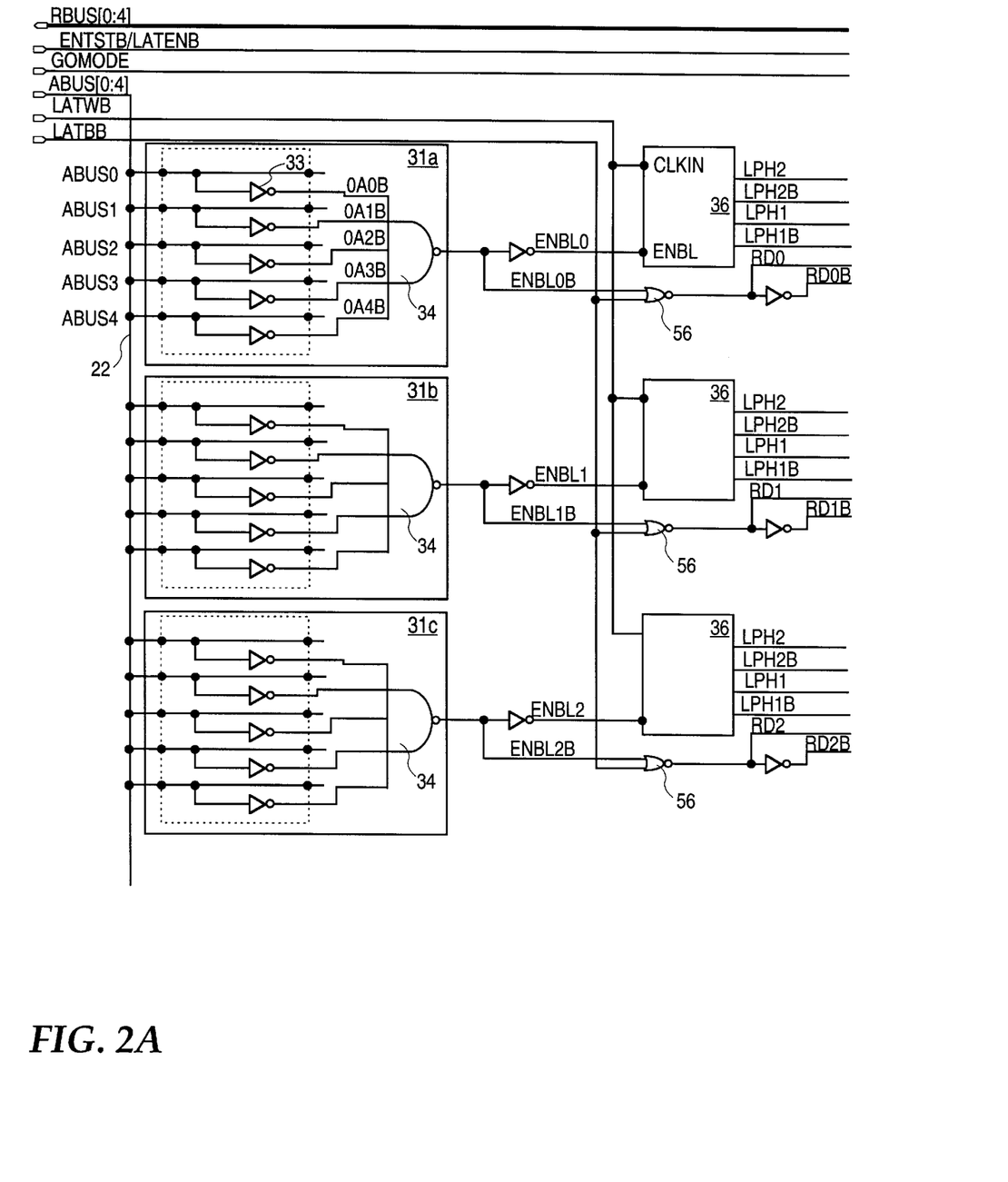
FIGS. 2A and 2B comprise a partially-block, partially-schematic diagram illustrating circuitry used in the invention.
Figure 2B:
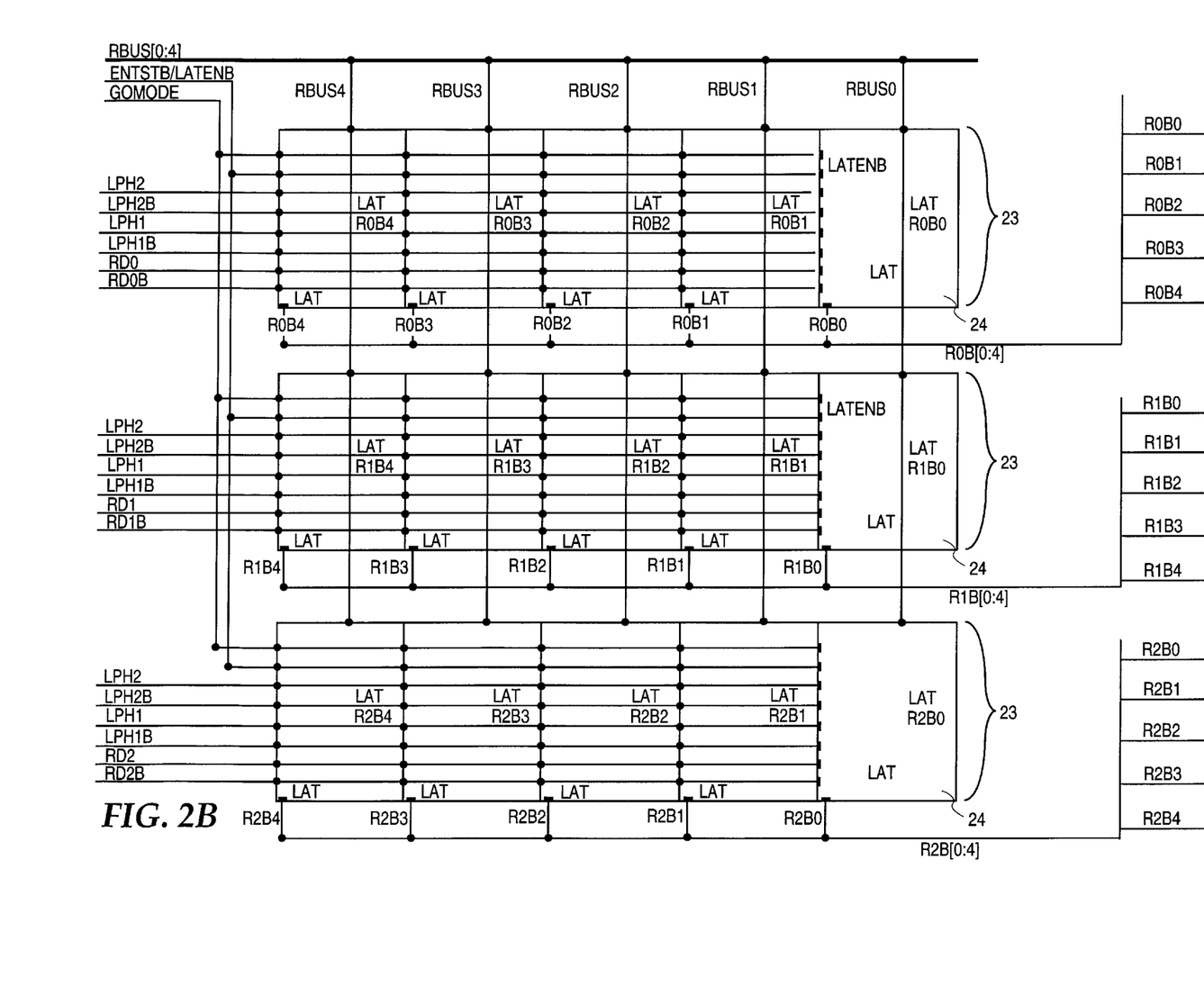

FIGS. 2A and 2B illustrate in partially-block form a circuit 30 including three of the test mode registers 23 illustrated in block form in the circuit of FIG. 1. Additional registers 23 positioned at other points on the integrated circuit are essentially identical to those illustrated in FIG. 2. Each register 23 has associated therewith addressing circuitry 31 used for selecting the appropriate one of the registers 23 to which data is directed. The circuitry 31 for addressing each register 23 includes a connection from each of the five conductors of the address bus ABUS 22 illustrated in FIG. 1. The signal on each conductor of the address bus is transferred as an input to a NAND gate 34. The transfer is accomplished in the upper circuit 31*a* for each of the bus conductors through an inverter 33. On the other hand, the next circuit 31*b* transfers the input signal on the upper conductor from the address bus directly to the NAND gate 34 and inverts each of the other inputs to the NAND gate 34. In a similar manner, the input signals provided from the address bus 22 are distinctly coded so that a particularly register 23 is selected by a particular address.

When all five inputs to the particular register are present in the proper state, a signal is generated by the NAND gate 34 for the particular register, inverted, and sent to a clock generating circuit 36 associated with the particular register as an enabling input. By using the addressing input as an enabling input to the clock generating circuitry, only the clock circuitry associated with the particular register is activated. Also provided as input to each of the clock generating circuits 36 is the write signal LATWB from the command state machine 10. The signal is used as an input to generate clock signals for driving the particular register 23.

Figure 3:
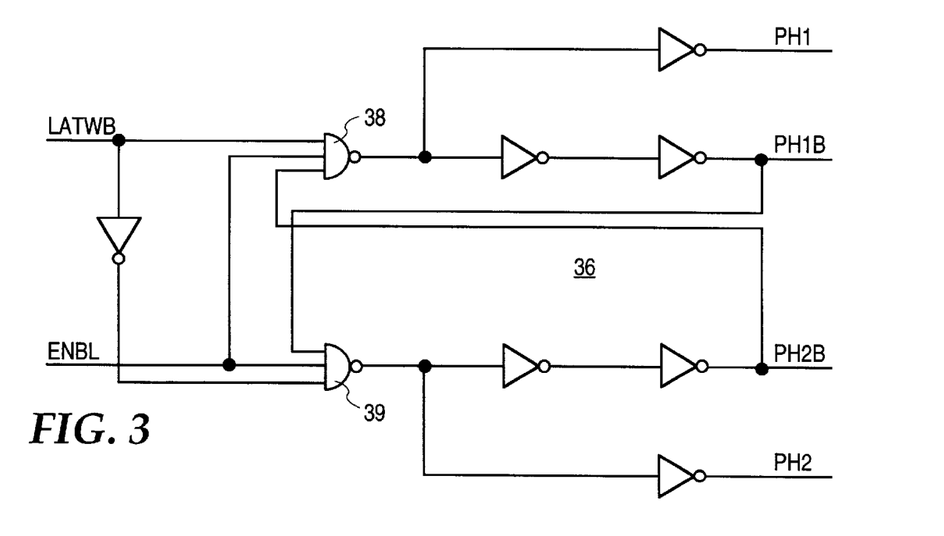
FIG. 3 is a circuit diagram illustrating in detail a portion of the circuitry of FIG. 2.

FIG. 3 illustrates a single one of the clock generating circuits 36. As may be seen, the circuit 36 includes a pair of NAND gates 38 and 39. The gates each receive the enable signal generated by the addressing circuitry 31. The gate 38 also receives the LATWB write signal from the command state machine 10 as a clock input while the gate 39 receives the inverse of that write signal. Each NAND gate 38 and 39 is also connected to receive as an input a signal indicating the condition of the output of the other NAND gate 38 or 39.

Figure 5:
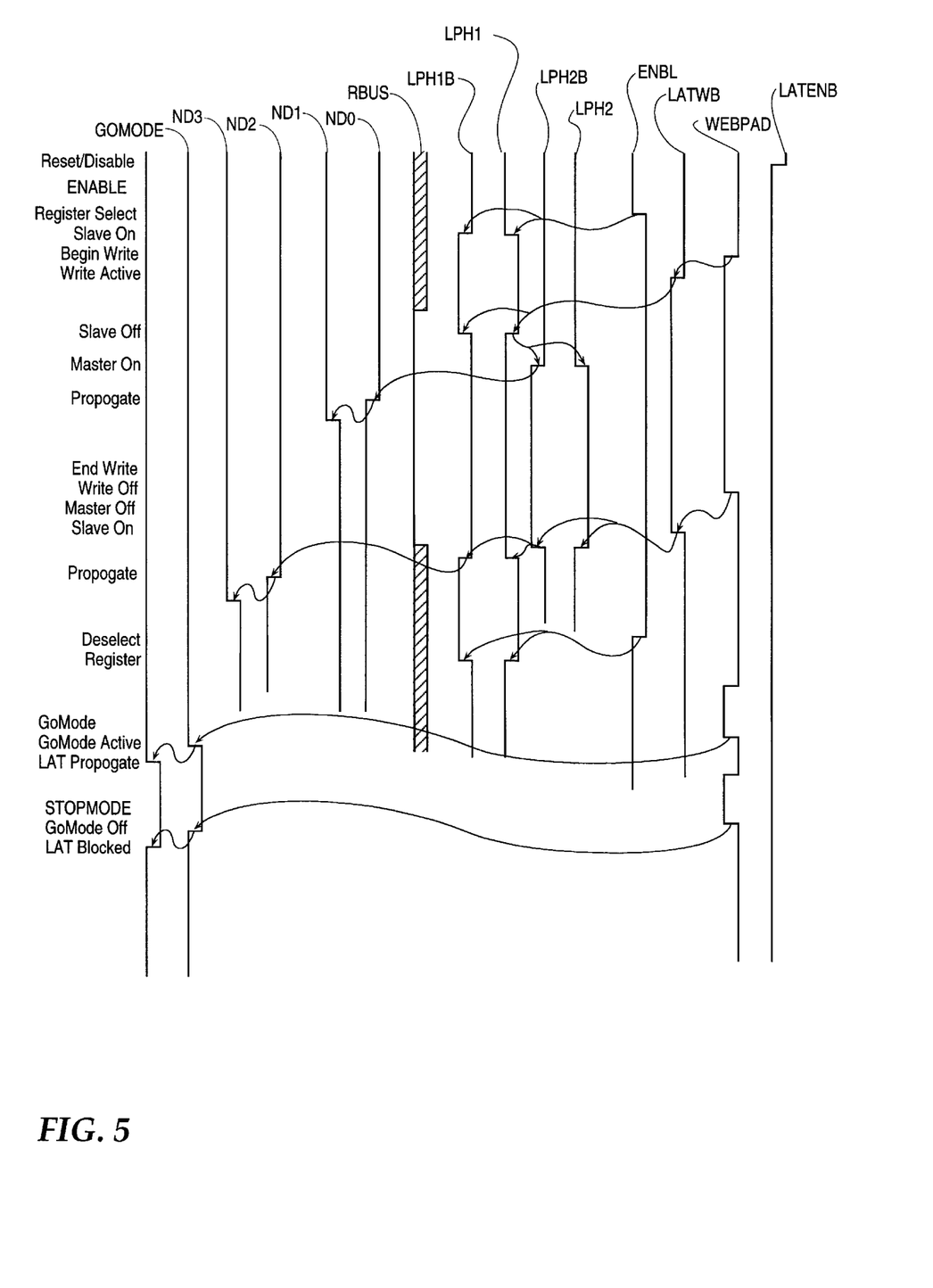
FIG. 5 is timing diagram useful in illustrating the operation of the invention.

In the condition is which the register is not addressed, the enable signal ENBL is at the zero level (see FIG. 5). This generates a one at the output of each of the NAND gates 38 and 39 and produces a zero as an output signal LPH1 (a slave clock), a one as an output signal LPH1B (an inverted slave clock), a zero as an output signal LPH2 (a master clock), and a one as an output signal LPH2B (an inverted master clock). The signals LPH1B and LPH2B are fed back to the inputs of the NAND gates 38 and 39 as ones. As will be seen in the following description, the zero values at each of the clocks LPH1 and LPH2 disable the input to the particular register.

When the register 23 is addressed, the enable signal ENBL becomes a one. The write signal LATWB which generates the clock signals is active low so that until a write signal appears, the NAND gate 38 provides a zero at its output. This value generates a one as the output signal LPH1 (the slave clock) and a zero as the output signal LPH1B (the inverted slave clock fed back to the NAND gate 39). At this time, the output LPH2 (master clock) is a zero; and output LPH2B (inverted master clock) is a one. When the write signal LATWB goes active, a zero is applied at the NAND gate 38 generating a one at its output and a zero as the slave clock LPH1 signal. At the same time, the write signal is inverted and applied as a one at the input to the NAND gate 39. However, the signal LPH1B fed back is initially a zero so the gate 39 does not propagate the change until the output of the NAND gate 38 has changed to a zero and been propagated back to the input of the NAND gate 39. When this happens, the NAND gate 39 furnishes a zero at its output and a one is produced as the master clock signal LPH2. Thus, the effect of the write signal is to turn off the slave clock and slightly thereafter turn on the master clock.

When the write operation is completed and the write signal LATWB goes high and inactive, a one is applied at the input to the NAND gate 38 and a zero at the input to the NAND gate 39. The gate 39 switches, generating a one at its output and producing a zero at the master clock signal LPH2. However, the gate 38 is held off by a zero fed back as the inverted master clock signal LPH2B until the switching of the gate 39 is propagated back to its input. When the gate 38 switches, a zero is generated at its output and the slave clock becomes a one. Thus, the effect of the removal of the write signal is to turn off the master clock and slightly thereafter turn on the slave clock.

As will be seen, the slave clock and master clock signals are used for operating the individual latches 24 of the registers 23. These clock signals generated by the circuit 36 are furnished to each of the five individual latches 24 which make up the individual test mode registers 23. The clock signals are utilized to set the latch circuits 24 to the conditions determined by the input data on the input data bus RBUS 16. The test mode command signals determines the condition of the latches 24. However, the test mode command signals is not transferred as received to the various peripheral circuit which respond to the test mode command signals but is held in the latches until all of the registers have been filled with whatever data is to be used for each of the test modes. Then the states of the latches 24 of all of the registers are propagated simultaneously. In this way, intermediate states cannot be generated which might cause the misoperation of circuitry. Consequently, the memory array and associated circuitry are protected from the generation of undesirable commands.

Figure 4:
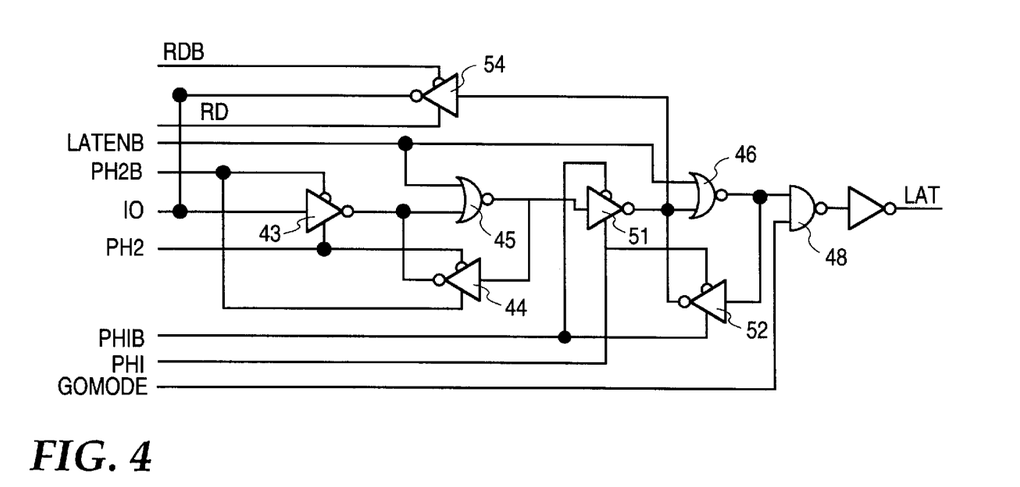
FIG. 4 is a circuit diagram illustrating in detail another portion of the circuitry of FIG. 2.

FIG. 4 illustrates an individual latch circuit 24. The circuit 24 is a master-slave latch. The master portion of the latch includes a pair of tristate inverters 43 and 44 and a NOR gate 45. The slave portion of the latch includes a NOR gate 46 and a pair of tristate inverters 51 and 52. Each of NOR gates 45 and 46 receives the reset input signal LATENB discussed above which is held high during periods during which the test modes are not enabled so that the latch 24 does not function. The reset signal forces the output of the NOR gate 46 low. The output of the NOR gate 46 is furnished as one of the inputs to a NAND gate 48 which provides the output from the latch 24. Consequently, in the presence of the reset signal (during the normal user operating condition of the command state machine 10), no output can be provided from any of the test mode latches 24.

Moreover, it will be recalled that when test modes are not selected, both the master clock and the slave clock signals are zeroes. Consequently, the tristate inverter 43 which receives the master clock (and the inverted value of the inverted master clock) and the tristate inverter 51 which receives the slave clock (and the inverted value of the inverted slave clock) are not enabled. On the other hand, the tristate inverters 44 and 52 which receive the opposite values of both those clocks are enabled. Since the NOR gates 45 and 46 each provide a zero condition at their output terminals, a one appears at each of the inputs to the NOR gate 45 and 46 through these inverters.

Thus, when the test mode enable signal LATENB goes active low at the input to each of the NOR gates 45 and 46, a zero will continue to be furnished at the output of each of those gates because the other input to each remains a one. These zero values at the output of each of the NOR gates continue to be inverted and fed back as ones to the inputs of each of these gates 45 and 46 by the inverters 44 and 52. However, even were a one value at the output of the NOR gate 46 to appear, it would not be propagated to the output of the latch because the NAND gate 48 at the output of the latch has its input held low until the signal GOMODE appears.

It will be recalled that when a particular register 23 is addressed to produce the test mode enable signal ENBL at the clock generator circuit 36, a slave clock signal of one and a master clock signal of zero are produced. Thus, when test modes are enabled and the latch is addressed, the inverter 51 is enabled and the inverter 52 is disabled. This causes the zero at the output of the NOR gate 45 to be inverted and a one to be furnished at the input to the NOR gate 46. The one generates a zero at the output of the NOR gate 46. This signal is not fed back since the inverter 52 is disabled.

It will also be recalled that when a write enable signal is received at the clock generator 36, the slave clock which has been a one becomes a zero and shortly thereafter the master clock becomes a one. In the latch 24, when the slave clock goes to zero, the inverter 51 turns off and the inverter 52 turns on. Since the state at the output of the NOR gate 46 was a zero, a one is transferred by the inverter 52 to the input to the NOR gate 46. Thus, the value has not changed but has been stored by the slave portion of the circuit even though the inverter 51 has turned off. The master clock then turns on the inverter 43 and turns off the inverter 44. Presuming that a one is present on the data input conductor as signal IO, the one is inverted and transferred to the input of the NOR gate 45 where it is again inverted and appears as a one at the input to the inverter 51. Since the inverter 51 is off, the data is not propagated further. Thus, the condition of the slave output is maintained even though the master output has changed.

However, when the write signal is removed, the master clock assumes a zero state; and this is followed shortly by the slave clock assuming a one state. When the master clock goes to zero the inverter 43 is disabled and the inverter 44 is enabled. This causes the one condition at the output to the NOR gate 45 to be fed back as a zero at its input and maintains the one value at the output of the NOR gate 45. When the slave clock turns on the inverter 51, the one at its input is propagated as a zero to the input of NOR gate 46, and therefore a one is propagated to the output of the NOR gate 46. Since the inverter 52 is turned off by the slave clock, the value is not fed back.

Of course, each of the other four latches 24 in the addressed register is receiving input data in a similar manner. However, none of the data in any of the latches is transferred to the output of the latch since the GOMODE signal is still held low and the output is disabled. Even though only a single register 23 may be addressed at any one time, the use of the GOMODE signal and the arrangement for disabling NAND gate 48 until that signal is received allows data to be stored in the latches of a register even after the write command is removed and some other register 23 is addressed to store additional data used by the test mode command. Thus, data may be placed in all of the registers 23 needed for the particular command and none will be propagated to the output until the command is ready to execute.

At the NAND gate 48, the presence of the GOMODE signal is required before the data stored by the latch is propagated to the rest of the peripheral circuitry which is to be tested by the data. In this manner, it is only when this GOMODE signal is received that the data is propagated. When all of the registers which are to receive data have been loaded, all of these data signals contained in the latches are propagated simultaneously to the peripheral circuitry as a plurality of test signals. In this manner, spurious conditions are not allowed to be generated by the test mode commands.

It should be noted that the master-slave arrangement of the latches 24 is especially useful where it is desired to assert or activate different test mode signals from the same register 23 in a sequence, rather than all simultaneously.

For example, a series of five bits in the latches 24 of one register 23 may be used to provide a first test mode signal. A next test mode signal in the same register 23 may vary from the first only in the condition of one latch. A second set of signals containing this second test mode signal may be written to the master portion of the latch while the output at the slave portion of the latch remain the same until the inverter 51 is turned on. This operation may be performed while the GOMODE signal is active. The result is to keep active and valid all but the one changing bit during the process of writing that bit. If this feature is not necessary, the individual latches 24 may each be implemented by simple D latches.

Also included in the latch circuit 24 is another tristate inverter circuit 54 which is enabled by the presence of a latch read command on the lines RDB and RD for transferring the condition at the output of the slave tristate inverter 51 to the data bus. It will be noted that the read signals are provided through NOR gates 56 illustrated in FIG. 2 and are only activated when the address bus selects that particular register 23.

In a manner similar to the application of the GOMODE signal for transferring the test mode signals throughout the array and other circuitry, a test mode stop signal generated external to the circuitry of this invention terminates the GOMODE signal and terminates the transfer of test mode signals simultaneously. This also assists in preventing extraneous and undesirable test mode signals from being propagated through the peripheral circuitry.

Thus, the operation of the circuitry to implement the test conditions is as follows. In the typical user modes of operation of the command state machine, a reset condition is applied to all of the test mode latches 24 to hold them in the inoperative condition so that they cannot be activated by the user. A test mode enable signal removes the reset condition. This is followed by a write latch signal to initiate the write operation. The address and data for the addressed latches are then transferred to place the latches into the appropriate conditions. Several such sequences may be required to load data into various registers 24 to implement a given mode. Finally, when all registers have been loaded, a test mode go signal causes the output of each of the latches to be placed simultaneously on the conductors to the peripheral circuitry at which the signals are utilized. Once the particular test mode command has been implemented, a test mode stop signal terminates the test mode go signal so that the outputs of the latches of all of the registers are removed simultaneously. In this manner, extraneous test mode signals are eliminated.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. Circuitry for propagating a plurality of test signals to a memory for testing the memory, comprising:

a plurality of multi-bit registers for storing a plurality of data and for generating the test signals which are sent to the memory in accordance with the data stored, wherein each of the plurality of multi-bit registers comprises a plurality of latches for storing one of the data and each of the data comprises plurality of data bits each of which is stored in one of the plurality of latches;

an addressing circuit coupled to the plurality of multi-bit registers for receiving a plurality of addresses to serially write the data into the plurality of multi-bit registers in accordance with the addresses, wherein the addressing circuit selects one of the plurality of multi-bit registers to receive one of the data at one time in accordance with one of the addresses received such that the data are serially written into the plurality of multi-bit registers;

a control circuit coupled to the plurality of multi-bit registers for enabling the plurality of registers to serially store the data and for simultaneously activating each of the plurality of latches in each of the plurality of multi-bit registers to output each of the plurality of data bits of each of the data to simultaneously provide the test signals to the memory after all of the data have been stored in the plurality of multi-bit registers by the addressing circuit.

2. The circuitry of claim 1, wherein each of the plurality of latch circuits have a master storage for receiving the data bit of one of the data, and a slave storage for holding the data bit received by the master storage during a period when other registers of the plurality of multi-bit registers are receiving data.

3. The circuitry of claim 2, wherein the master storage is disabled by the addressing circuit (1) from transferring any data to the slave storage when the master storage is receiving the data bit, and (2) from receiving any data when the master storage is transferring the data bit to the slave storage.

* * * * *